United States Patent [19]

Sato

[11] Patent Number: 4,899,312

[45] Date of Patent: Feb. 6, 1990

[54] SEMICONDUCTOR MEMORY

[75] Inventor: Katsuyuki Sato, Tokyo, Japan

[73] Assignee: Hitachi, Ltd., Tokyo, Japan

[21] Appl. No.: 214,542

[22] Filed: Jul. 1, 1988

Related U.S. Application Data

[63] Continuation of Ser. No. 820,326, Jan. 21, 1986, Pat. No. 4,758,995.

[30] Foreign Application Priority Data

Jan. 23, 1985 [JP] Japan ................................. 60-9046

[51] Int. Cl.$^4$ .............................................. G11C 8/00
[52] U.S. Cl. ........................... 365/230.09; 365/230.02
[58] Field of Search ............... 365/189, 190, 149, 195, 365/194, 230, 233, 230.02, 230.09, 230.03

[56] References Cited

U.S. PATENT DOCUMENTS 4,567,579 1/1986 Patel et al. ......................... 365/189
4,618,947 10/1986 Tran et al. ......................... 365/230
4,758,995 7/1988 Sato ..................................... 365/230

Primary Examiner—Joseph A. Popek
Attorney, Agent, or Firm—Antonewlli, Terry & Wands

[57] ABSTRACT

An improved DRAM which includes a plurality of main amplifiers for amplifying and storing signals read out to a plurality of common data lines in accordance with an internal address signal, a main amplifier control circuit for outputting the outputs of the main amplifiers sequentially in synchronism with changes in a column address strobe signal and an address counter for performing an addressing operation midway in the sequential reading operations of the plural main amplifiers. The present invention also includes a column selecting circuit for switching column switches in accordance with the address counter to cause data to be read out continuously at a high speed by extending a nibble mode.

20 Claims, 5 Drawing Sheets

SEMICONDUCTOR MEMORY

BACKGROUND OF THE INVENTION

The present invention relates to a semiconductor memory and, more particularly, to a technique which is effective when used in a dynamic RAM (i.e., Random Access Memory) capable of a nibble mode operation.

In the dynamic RAM, for example, there has been proposed in addition to a one-bit access system an access system of the so-called "nibble mode" (which should be referred to "Hitachi Memory Data Book", pp. 307 to 320, issued by Hitachi, Ltd., in September 1983, for example). In that nibble mode, four-bit data is output serially by a selection signal which is generated by the counted output of a shift register or binary counter made operative in synchronism with a column address strobe signal $\overline{CAS}$.

In the aforementioned nibble mode, when other four-bit data is read out subsequently to the reading operation of the preceding four-bit data, it becomes necessary that a column selecting circuit has to be once reset to supply an initial address. In this case, however, the interval between the reading operations of every four-bits takes a relatively long time.

SUMMARY OF THE INVENTION

An object of the present invention is to provide a semiconductor memory to which a high-speed continuous accessing function is added.

Another object of the present invention is to provide a novel access system for the semiconductor memory.

Still another object of the present invention is to speed up the nibble mode of the dynamic RAM.

The above-specified and other objects and the novel features of the present invention will become apparent from the following description taken with reference to the accompanying drawings.

A representative of the invention to be disclosed hereinafter will be briefly described in the following.

A semiconductor memory has a plurality of circuits for storing a plurality of signals which are read out, a control circuit for reading out the outputs of the storage circuits sequentially, a built-in address counter for performing an address counting up (step-by-step) operation midway in the sequential reading operations, and a column selecting circuit for switching a column switch in accordance with the address counter midway in the sequential reading operations.

DESCRIPTION OF THE PREFERRED EMBODIMENT

Figure 1:
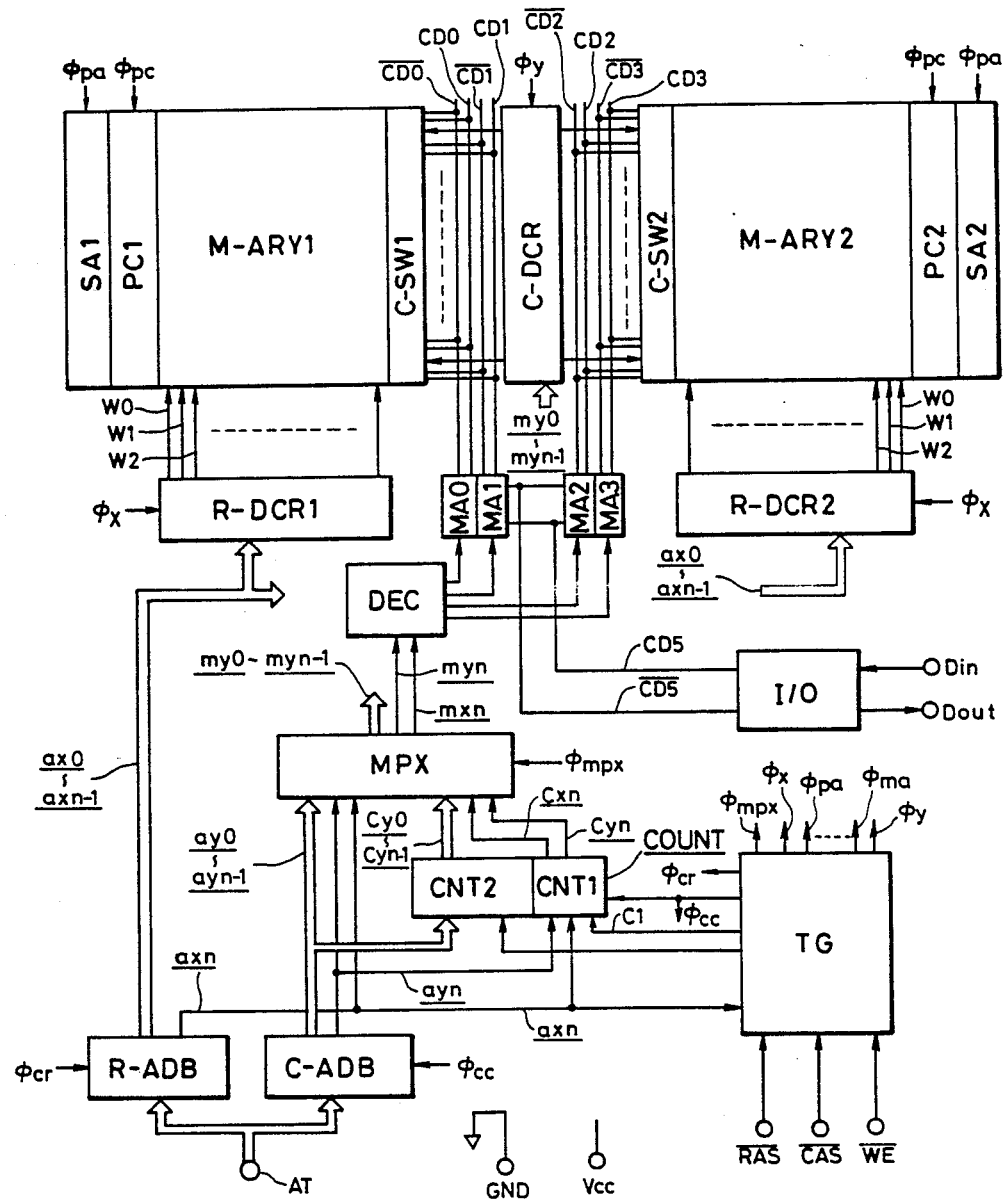
FIG. 1 is a block diagram showing the internal structure of one embodiment of the present invention.

FIG. 1 is a block diagram showing the dynamic RAM according to the present invention.

The RAM of the present embodiment is equipped with: a group of address terminals AT fed with multiplexed row and column address signals; a reference potential terminal GND supplied with the ground potential of the circuit; a supply terminal Vcc adapted to be supplied with a supply voltage such as +5 V; control terminals $\overline{RAS}$, $\overline{CAS}$ and $\overline{WE}$ adapted to be fed with a row address strobe ($\overline{RAS}$) signal, a column address strobe ($\overline{CAS}$) signal and a write enable ($\overline{WE}$) signal; a data output terminal $D_{out}$; and a data input terminal $D_{in}$.

The RAM of the present embodiment is further equipped, although not limited thereto: two divided memory arrays M-ARY1 and M-ARY2; row address decoders R-DCR1 and R-DCR2 corresponding one-to-one to the memory arrays M-ARY1 and M-ARY2, respectively; a column address decoder C-DCR arranged between the memory arrays M-ARY1 and M-ARY2; a row address buffer R-ADB corresponding to the row address decoders R-DCR1 and R-DCR2; a column address buffer C-ADB corresponding to the column address decoder C-DCR; main amplifiers MA0 to MA3; an input/output circuit I/O; a timing generating circuit TG for generating a variety of timing signals which will be described hereinafter.

For a high-speed continuous accessing operation, the RAM of the present embodiment is further equipped with a multiplexer MPX and a counter COUNT, as shown.

The individual circuit elements constructing the RAM of the present embodiment are formed on a semiconductor substrate such as a piece of single-crystalline silicon by the known technique for fabricating a CMOS (i.e., Complementary MOS) integrated circuit.

The integrated circuit is formed on the semiconductor substrate made of P-type single-crystalline silicon, although not especially limited thereto. An N-channel insulated gate field effect transistor (which will be shortly referred to as a "MOSFET") comprises: source and drain regions which are formed on the surface of that semiconductor substrate; and a gate electrode of polycrystalline silicon formed through a thin gate insulating film on the surface of the semiconductor substrate between the source region and the drain region. A P-channel MOSFET is formed in an N-type well region which is formed on the surface of the aforementioned semiconductor substrate. As a result, the semiconductor substrate has a substrate (body) gate which is common to a plurality of N-channel MOSFETs formed thereon. The N-type well region has the substrate gate of the P-channel MOSFET formed thereon. The substrate gate, i.e., N-type well region of the P-channel MOSFET is coupled to the supply terminal Vcc. Although not limited thereto, a built-in substrate back-bias voltage generating circuit (not illustrated) generates a negative back-bias voltage to be supplied to the aforementioned semiconductor substrate in response to the positive supply voltage such as +5 V which is applied between the supply terminal Vcc and the reference potential terminal or the ground terminal constituting the external terminals of the integrated circuit. Thus, the back-bias voltage is applied to the substrate gate of the N-channel MOSFET. As a result, the junction (or parasitic) capacity between the source and drain of the N- channel MOSFET and the semiconductor substrate is reduced so that the operations are sped up.

The memory array M-ARY1 is constructed into a folded bit (or data) line type, although not limited thereto. The memory array M-ARY1 is constructed of: a plurality of complementary data or bit lines extending transversely of the drawing in parallel with one another; row address selecting lines including a plurality of word lines W0, W1 and W2 and dummy word lines extended longitudinally in the drawing; a plurality of memory cells having their respective data input/output terminals coupled to the respectively corresponding data lines and their respective selecting terminals coupled to the respectively corresponding word lines; and a plurality of dummy cells. Each of the memory cells is composed, as will be described in detail hereinafter with reference to FIG. 2, of: a dynamic memory cell having the structure of a 1-MOS transistor/cell, i.e., a MOSFET acting as a selecting switch or a transmission gate element; and a MOS capacitor connected in series with the former and acting as information storage means.

To the memory array M-ARY1, there are coupled a sense amplifier SA1, a precharge circuit PC1 and a column switch circuit C-SW1. The memory array M-ARY1 and the aforementioned individual circuits coupled to the former will be described in detail hereinafter with reference to FIG. 2.

The functions of the sense amplifier SA1 and the precharge circuit PC1 are substantially similar to the well-known functions of a dynamic memory. The precharge circuit PC1 sets the potential of each complementary data line of the memory array M-ARY1 at a precharge level before the access of the memory is started.

The sense amplifier SA1 is selectively brought into an operating state by a timing signal $\phi pa$ in the data write-/read operation. The read voltage, which is read out of the memory cell coupled to one data line by the selecting operation of the word lines, is amplified by the sense amplifier referring to both the read voltage and a reference voltage which is set by the dummy cell coupled to the other data line by the selecting operation of the dummy word lines. Thus, the complementary data lines are amplified to high/low levels. Although not limited thereto the sense amplifier is constructed of a CMOS latch circuit, as will become apparent with reference to FIG. 2.

According to the present embodiment, although not limited thereto, in order to make it possible to access two-bit data simultaneously for the memory array M-ARY1, there are provided two pairs of common complementary data lines $\overline{CD0}$ and $\overline{CD0}$, and $\overline{CD1}$ and $\overline{CD1}$ for the memory array M-ARY1. The column switch circuit C-SW1 is constructed, as will be described hereinafter with reference to FIG. 2, such that it couples the two-grouped complementary data lines of the memory array M-ARY1 simultaneously with the two-grouped common complementary data lines $\overline{CD0}$ to CD1 when it is operated.

The memory array M-ARY2 is constructed similarly to the memory array M-ARY1, and a sense amplifier SA2, a precharge circuit PC2 and a column switch circuit C-SW2 coupled to the memory array M-ARY2 are also constructed similarly to the corresponding circuits of the memory array M-ARY1

In a RAM of the multiplexed type like present embodiment, the address input terminal AT is fed with both a row address signal (which will be indicated by an address signal AX) in synchronism with a row address strobe signal $\overline{RAS}$ and a column address signal (which will also be indicated by an address signal AY) in synchronism with the column address signal $\overline{CAS}$.

The row address buffer R-ADB has its operations controlled by a timing signal $\phi cr$, which is generated at the start of access of the memory, i.e., the timing signal $\phi cr$ which is generated from the timing generating circuit TG in synchronism with the fall of the row address strobe signal $\overline{RAS}$. Thus, the row address buffer R-ADB receives an n-bit address signal AX through the external terminal AT in synchronism with the row address strobe signal $\overline{RAS}$ and accordingly generates internal complementary address signals ax0 to axn. Of these complementary address signals ax0 to axn, the complementary address signals ax0 to axn-1 except a predetermined bit such as the most significant bit axn are sent out to the row address decoders R-DCR1 and R-DCR2. The 1-bit internal complementary address signal axn is deemed as a nibble operation control signal and is fed to the counter COUNT, the timing generating circuit TG and the multiplexer MPX, which will be described hereinafter. The non-inverted address signal ax0 and the inverted address signal $\overline{ax0}$ of opposite phase are indicated by the aforementioned address signal ax0. Other signals to be described hereinafter are also indicated in a similar manner in the following description and in the drawings.

The row address decoder R-DCR1 is equipped with a plurality of output terminals which are coupled in a one-to-one corresponding manner to the word lines W0 to W2 and the dummy word lines of the memory array M-ARY1, respectively. The row address decoder R-DCR2 is likewise equipped with a plurality of output terminals which are coupled to the word lines and dummy word lines of the memory array M-ARY2.

The row address decoders R-DCR1 and R-DCR2 have their operations controlled by a word line selecting timing signal $\phi x$ to decode the internal complementary address signals ax0 to axn-1 fed from the row address buffer R-ADB. Thus, of the plural word lines and dummy word lines, of the memory arrays M-ARY1 and M-ARY2, the internal complementary address signals ax0 to axn-1, are simultaneously set at the selected level in synchronism with the word line selecting timing signal $\phi x$.

The column address buffer C-ADB has its operations controlled by a timing signal $\phi cc$ of the timing generating circuit TG to generate internal complementary address signals ay0 to ayn in response to the address signal AY which is fed to the address input terminal in synchronism with the column address strobe signal $\overline{CAS}$. The timing signal $\phi cc$ is generated in synchronism with the first fall of the column address strobe signal $\overline{CAS}$ when the access of the memory is started. One bit of the internal complementary address signals ay0 to ayn, i.e., the most significant bit signal ayn of the present embodiment are deemed as the nibble operation control signal. The internal complementary address signals ay0 to ayn-1 are fed to one input of the multiplexer MPX. Although not limited thereto, the address signal ayn is also fed to the one input of the multiplexer MPX. Those complementary address signals ay0 to ayn-1 and ayn are fed as an initial value to the address counter COUNT.

The address counter COUNT is constructed of two kinds of address counters CNT1 and CNT2.

The address counter CNT1 is provided for controlling transfer of 4-bit data in the nibble operation and high-speed continuous access of the memory. More specifically, the data to be transferred of the 4-bit data is determined according to the counted number of the address counter CNT1. This counter CNT1 is so constructed, although not limited thereto, of 2-bit binary counters connected in cascade to consititute a counter which counts up to the number 4 ($=2^2$).

The 2-bit binary counters constructing the address counter CNT1 have their respective initial values determined by the internal complementary address signals axn and ayn which are outputted from the row address buffer R-ADB and the column address buffer C-ADB when the access to the memory is started. In accordance with the present embodiment, although not limited thereto, the timing signal $\phi cc$ for controlling the operations of the column address buffer C-ADB is used as an input control signal for controlling the initial value of the address counter COUNT.

The address counter CNT1 counts in a (step-by-step) operation in response to an internal timing signal C1 which is output from the timing generating circuit TG. This internal timing signal C1 is generated in response to the drop of the column address strobe signal $\overline{CAS}$ to the low level when the row address strobe signal (which will be indicated at $\overline{RAS}$) takes the low level at the external terminal $\overline{RAS}$. Therefore, it may be understood that the address counter CNT1 is activated to perform the step-by-step counting operation by the column address strobe signal $\overline{CAS}$. The 2-bit complementary address signals cxn and cyn output from the address counter CNT1 are used for selecting the main amplifiers MA0 to MA3.

The address counter CNT2 is provided to make possible the high-speed continuous access of the data. The address counter CNT2 outputs the address signals cy0 to cyn-1 which have a bit number equal to that (i.e., the n bits) required in the column address decoder C-DCR. The address counter CNT2 is constructed of n-bit binary counters which are connected in cascade. The address counter CNT2 has its initial value set by the internal complementary signals ay0 to ayn-1 which are output from the column address buffer C-ADB.

The address counter CNT2 counts once for every four counts of the address counter CNT1 in other words, each time when the continuous transfer of the 4-bit data is executed by the address counter CNT1.

However, the step-by-step control of the address counter CNT2 in the reading operation is controlled according to the present invention so as to increase the speed of the continuous access of the data. The address counter CNT2 counts simultaneously with the start of the data transfer of every four bits in the data reading operation, as will become apparent from the description to be made hereinafter. In other words, the address counter CNT2 counts during the reading operation before the continuous reading operation of the data of every four bits is completed. Thus, a new column address signal is prepared by the address counter CNT2 before the reading operation of the 4-bit data, given beforehand to the main amplifiers MA0 to MA3, is completed.

The step-by-step timing of the address counter CNT2 is altered in the writing operation relative to the step-by-step timing of the reading operation. In other words, the address counter CNT2 is subjected in the data writing operation to the step-by-step operation each time the continuous writing operation of the data of every four bits is completed. The reason why the high-speed continuous access can be made even in the case when the step-by-step timing of the address counter CNT2 is thus delayed in the data writing operation will be described hereinafter.

The step-by-step pulses required in the address counter CNT2 are output from the timing generating circuit TG. In order to generate those step-by-step pulses, the timing generating circuit TG is equipped with a 2-bit binary counter CNT3 which will be described in detail hereinafter with reference to FIG. 4. The binary counter CNT3 is subjected to the step-by-step operation in synchronism with the binary counter CNT1.

The step-by-step pulses required in the address counter CNT2 can be generated by the following structure making use of the address counter CNT1, for example, even without any provision of the counter CNT3.

For example, there may be provided an address counter CNT1, a register which is set with internal complementary address signals axn and ayn as its initial values and a logic circuit which receives both of the output of the address counter CNT1 and output of the register. This logic circuit is constructed to compare the output of the address counter CNT1 and the output of the aforementioned register and to compare the output of the address counter CNT1 and the value which is prepared by subtracting the content of the register by 1. The data, which is smaller by 1 than that of the data set in the register, can be obtained by a relatively simple logic transformation of the two bits output from the register. Thus, the aforementioned logic circuit generates the step-by-step pulses for every four count operations of the address counter CNT1. In this case, however, there is an increase in the number of the circuit elements.

The complementary address signals cy0 to cyn-1 generated by the aforementioned address counter CNT2 are fed to the other input of the multiplexer MPX. Although not limitative thereto, the complementary address signals cyn and cxn generated by the address counter CNT1 are also fed to the other input of the multiplexer MPX.

The multiplexer MPX has its operations controlled by a timing signal $\phi mpx$ output from the timing generating circuit TG. The timing signal $\phi mpx$ is set at a level to cause the multiplexer MPX to select the outputs ay0 to ayn and axn of the address buffers R-ADB and C-ADB, before and at the time of the access of the memory; in other words, when the row address strobe signal $\overline{RAS}$ is held at the high level and dropped to the low level. When the nibble operation mode is specified by the combination of the row address strobe signal $\overline{RAS}$ and the column address strobe signal $\overline{CAS}$, the timing signal $\phi mpx$ is set at such a level that the multiplexer MPX selects the outputs cy0 to cyn and cxn of the address counters CNT1 and CNT2. Thus, the multiplexer MPX outputs at its output terminal the complementary address signals my0 to myn and mxn which correspond to one group of the complementary address signals ay0 to ayn and axn, and cy0 to cyn and cxn. Of the complementary address signals my0 to myn outputted selectively through the multiplexer MPX, the complementary address signals my0 to myn-1 excepting, the most significant bit myn are fed to the column address decoder C-DCR. The complementary address signals myn and mxn are fed to a decoder DEC for controlling the operations of the main amplifiers MA0 to MA3.

According to the present embodiment, the multiplexer MPX is provided by considering the delay time after the access of the memory has been started and before the outputs of the address counters CNT1 and CNT2 are set at their initial values. When the access of the memory is started, more specifically, the internal complementary address signals output from the address buffers R-ADB and C-ADB are fed to the column address decoder C-DCR and the decoder DEC while bypassing the address counters CNT1 and CNT2. As a result, the speed of the first operation of the memory can be increased. However, the memory of the present embodiment operates even if the outputs of the address counters CNT1 and CNT2 are fed directly to the column address decoder C-DCR and the decoder DEC. Even with this alteration, the subsequent continuous accessing speed, except that of the first operation, is not substantially limited. Therefore, it should be understood that the multiplexer MPX has a function in increasing the speed of the memory to a higher value but is not essential for the present invention.

The column address decoder C-DCR has its operations controlled by the data line selecting timing signal or a column selecting timing signal $\phi y$ generated from the timing generating circuit TG and decodes the internal complementary address signals my0 to myn-1 fed from the multiplexer MPX. Thus, the column address decoder C-DCR outputs the column selecting signal in synchronism with the timing signal $\phi y$.

Figure 6:
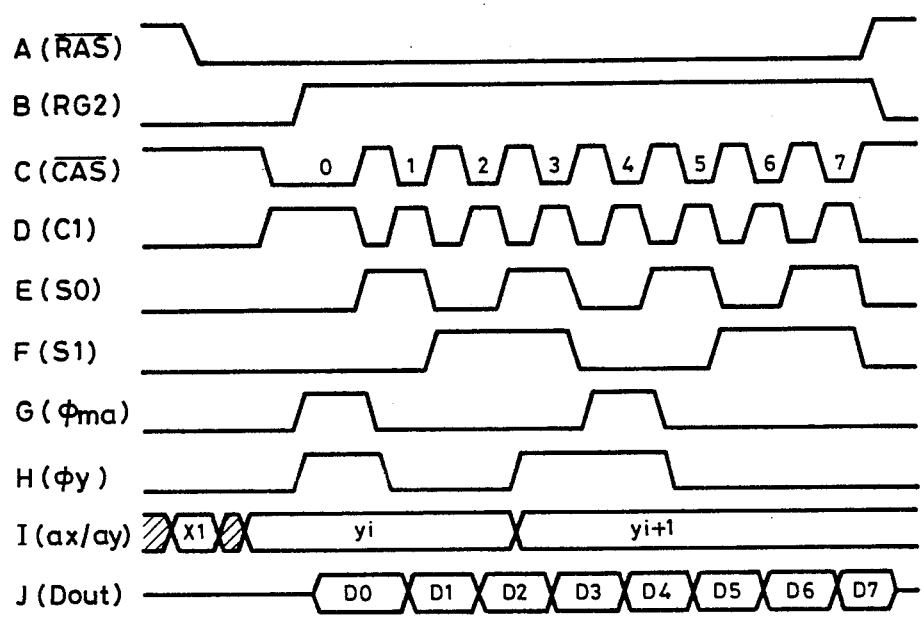
FIGS. 6 and 7 are timing charts for explaining the operations of the embodiment of FIG. 1.

This column selecting timing signal is set at the high level, as indicated by H in FIG. 6, if the instruction of reading operation is fed to the memory, i.e., if the write enable signal $\overline{WE}$ is held at the high level, for the period of time when the column address strobe signal $\overline{CAS}$ is set at the low level for the first time until the time when the column address strobe signal $\overline{CAS}$ is raised to the high level and for the period of time when the address counter CNT2 is subjected to the step-by-step operation until the time determined by the column address strobe signal $\overline{CAS}$.

The column switches C-SW1 and C-SW2 receive the selecting signal, which is generated by the aforementioned column address decoder C-DCR, to couple the respective two pairs of complementary data lines of the memory arrays M-ARY1 and M-ARY2 with four common complementary data lines CD0 and CD1, and CD2 and CD3, respectively.

The decoder DEC decodes the 2-bit address signals mxn and myn, which are fed from the multiplexer MPX, to output the control signals for selectively operating the four main amplifiers MA0 to MA3. The specific circuit of the decoder DEC will be described in detail hereinafter together with the main amplifier MA0 and the input/output circuit I/O with reference to FIG. 3.

The aforementioned common complementary data lines CD0 to CD3 are coupled to the input terminals of the main amplifiers MA0 to MA3, respectively. These main amplifiers MA0 to MA3 include latch circuits, as will be described in detail hereinafter with reference to FIG. 3. The latched (complementary) outputs of those main amplifiers MA0 to MA3 are synchronized in the data reading mode with both the selecting signal generated by the decoder DEC and the column address strobe signal $\overline{CAS}$, and are transmitted sequentially through common input lines CD5 and $\overline{CD5}$ to the common data output circuit which is included in the input/output circuit I/O.

This input/output circuit I/O is constructed of a reading data output circuit and a writing data input circuit. If a reading operation is commanded by the high level of the write enable signal $\overline{WE}$, the data output circuit is brought at a predetermined timing into its operative state. Thus, the outputs of the aforementioned main amplifiers MA0 to MA3 are amplified and sent out to the external terminal $D_{out}$ by the output circuit. If the writing operation is commanded by the low level of the write enable signal $\overline{WE}$, the data input circuit is rendered operative at a predetermined timing. Thus, the input data fed to the external terminal $D_{in}$ is transferred through the data input circuit and a later-described signal selecting circuit (although omitted from FIG. 1) in the main amplifiers to one of the common complementary data lines CD0 to CD3.

In response to the three external control signals $\overline{RAS}$ (i.e., the row address strobe signal), $\overline{CAS}$ (i.e., the column address strobe signal) and $\overline{WE}$ (i.e., the write enable signal), the timing generating circuit TG generates the aforementioned various timing signals necessary for the memory operations. Moreover, the timing generating circuit TG includes the 2-bit binary counter circuit CNT3, as has been described hereinbefore. The counted output of that counter circuit CNT3 is used for generating the column selecting timing signal $\phi y$ in the continuous reading operation, a main amplifier operation timing signal $\phi ma$ and step-by-step pulses to be fed to the aforementioned address counter circuit CNT2.

Figure 2:
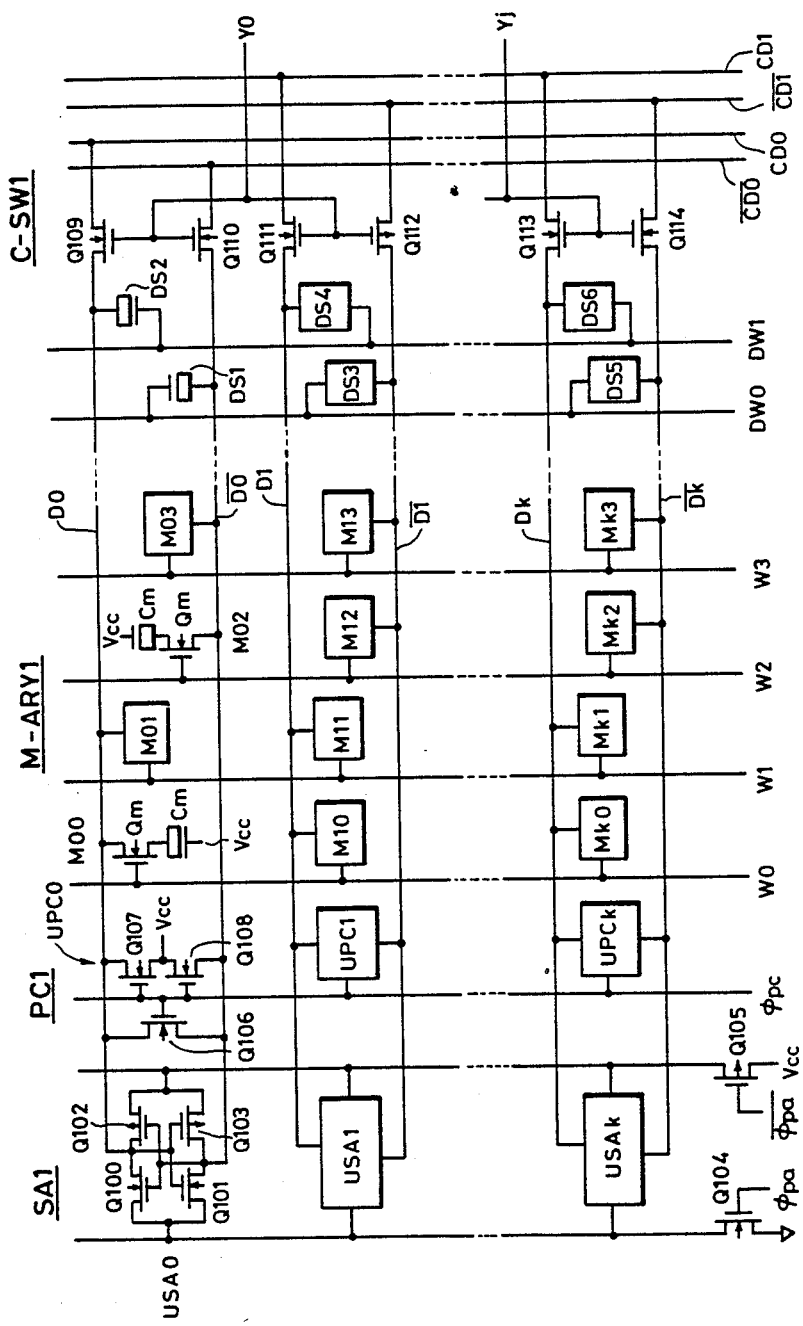
FIG. 2 is a specific circuit diagram showing a sense amplifier, a precharge circuit, a memory array and a column switch circuit.

FIG. 2 illustrates the specific circuit constructions of the memory array M-ARY1, the sense amplifier SA1, the precharge circuit PC1 and the column switch circuit C-SW1.

The memory array M-ARY1 is equipped with plural pairs of data lines D0 and $\overline{D0}$ to Dk and $\overline{Dk}$, the plural word lines W0 to W3, and a plurality of memory cells M00 to Mk3. Like the memory cell M00, each memory cell is composed of a switch MOSFET Qm and a MOS capacitor connected in series with the former.

Between the respective data lines and dummy word lines DW0 and DW1 intersecting the former, there are connected dummy cells DS1 to DS6, each of which is composed of a MOS capacitor, although not limited thereto.

The sense amplifier SA1 is composed, as shown in the drawing, of unit circuits USA0 to USAk provided in one-to-one correspondence to the respective pairs of the data lines, and power switch MOSFETs Q104 and Q105. The respective unit circuits are constructed, as shown in the drawing, of CMOS latch circuits having their inputs and outputs shared commonly and composed of P-channel MOSFETs Q102 and Q103 and N-channel MOSFETs Q100 and Q101.

The precharge circuit PC1 is constructed of a plurality of unit circuits UPC0 to UPCk, each of which is composed of an equalizing MOSFET Q106 connected between the paired data lines and precharging MOSFETs Q107 and Q108 connected between the respective data lines and the supply terminal Vcc.

The column switch circuit C-SW1 is composed of MOSFETs Q109 to Q114 which are controlled to be switched by column selecting signals Y0 to Yj.

The operations of those circuits will be described in the following.

First of all, when the memory is not accessed, i.e., when the row address strobe signal $\overline{RAS}$ is set at the high level, the timing signals φpa and φ̄pa for controlling the operations of the sense amplifier SA1 are set at the low and high levels, respectively, whereas a timing signal φpc for controlling the operations of the precharge circuit is set at the high level. Thus, the sense amplifier SA1 is held in its inoperative state because its power switch MOSFETs Q104 and Q105 are turned off. Each data line is held at such a precharge level as is substantially equal to the supply voltage Vcc, because the precharge circuit PC1 is rendered operative by the timing signal φpc. When the memory is not accessed, on the other hand, the word lines W0 to W3 are set at the non-selected or low level. Both the dummy word lines DW0 and DW1 are set at the non-selected high level.

If the access of the memory is started, in other words, if the row address strobe signal $\overline{RAS}$ is set at the low level, the timing signal φpc is synchronously set at the low level, and the precharge circuit PC1 is then rendered inoperative. After the precharge circuit PC1 has been rendered inoperative, the word line selecting timing signal φx (which should be referred to FIG. 1) is set at the high level so that the row address decoder R-DCR1 is rendered operative. In response to this, one of the word lines W0 to W3 is set at the selected level. When the word line is selected, the data of the memory cell is given to the corresponding data line. If the word line W0 is selected, for example, the data of the memory cells M00, M10 and Mk0 are given to the data lines D0, D1 and Dk. One of the dummy word lines DW0 and DW1 is set at the selected or low level in synchronism with the selecting timing of that word line. If the word line W0 is selected as above, for example, the dummy word line DW0 is set in a corresponding manner at the selected level. As a result, the reference potential is applied by the dummy cell to one of the paired data lines, i.e., the complementary data lines. Although not limitative thereto, in order that the reference potential may take an intermediate value of the level amplitude given to the data line by the memory cell and that relative dispersions, which are diagnosed between the capacitor Cm of the memory cell and the capacitor of the dummy cell as a result of the dispersions in the fabrication of the integrated circuit, may be reduced to a value as small as possible, the capacitor of the dummy cell is made to have substantially the same size as that of the memory cell, and the level amplitude given to the dummy word line is reduced to one half of that given to the selecting word line.

The timing signals φpa and φ̄pa are set at the high and low levels, respectively, after the word line and the dummy word line have been selected, in other words, after the timing signal φx has been set at the high level. Thus, the sense amplifier SA1 has its operations started to amplify the data signals given from the memory cells to the individual data lines.

The column selecting signals Y0 to Yj are set in r. 20 advance at the non-selecting level or low level. If the column address strobe signal $\overline{CAS}$ is set at the low level after the row address strobe signal $\overline{RAS}$ has been set at the low level, the timing signal φy is raised to the high level after a suitable delay time from the low level of signal $\overline{CAS}$ so that the operations of the column address decoder C-DEC (which should be referred to FIG. 1) are started. As a result, one of the column selecting signals Y0 to Yj is set at the selecting level or high level so that the column switch MOSFET is turned on. In the memory array M-ARY1, more specifically, the two pairs of the paired complementary data lines are coupled through the column switch circuit C-SW1 to the common complementary data lines $\overline{CD0}$ to CD1.

Figure 3:
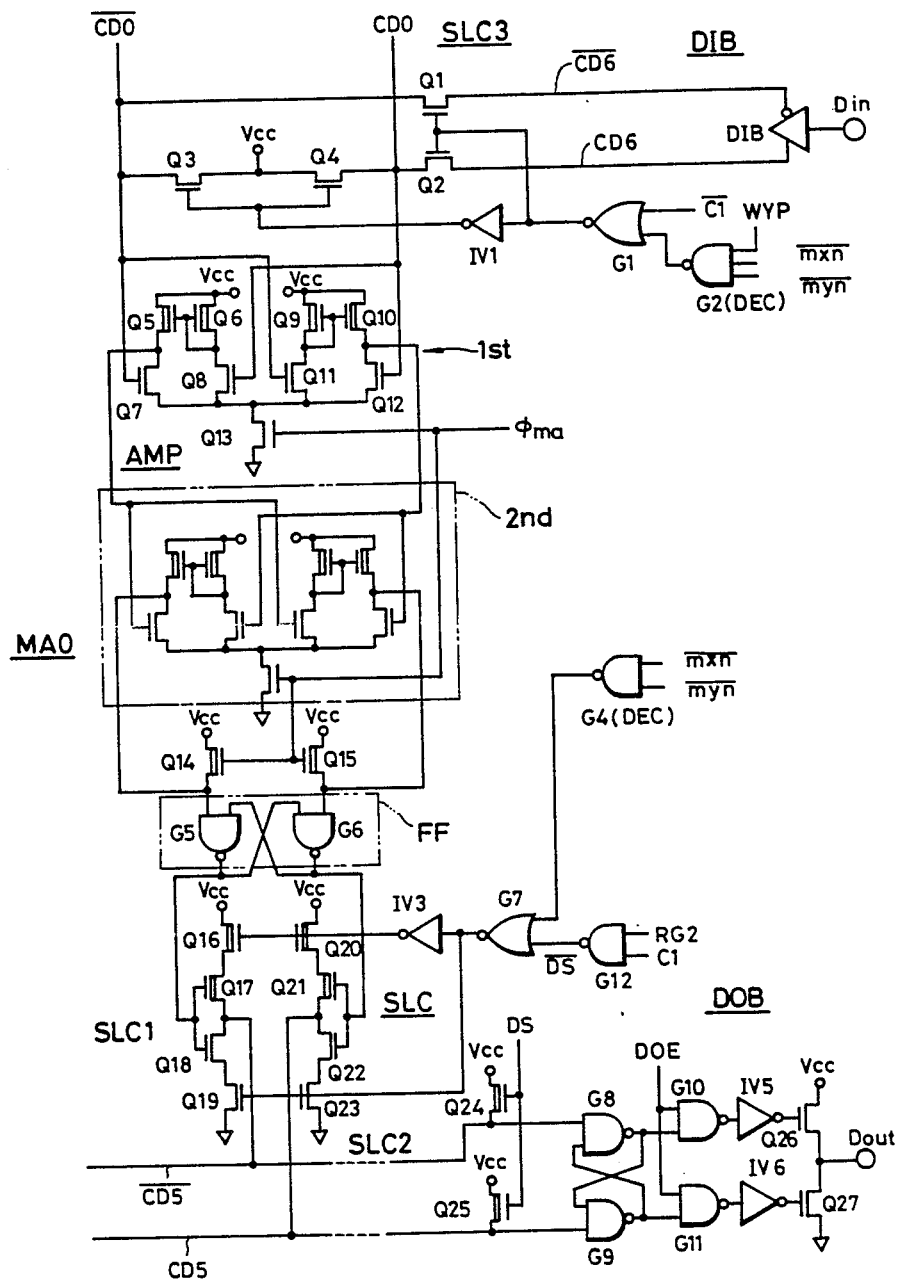
FIG. 3 is a specific circuit diagram showing a main amplifier and an input/output circuit.

FIG. 3 is a circuit diagram showing one embodiment of the data input and output lines.

The common complementary data lines CD0 and $\overline{CD0}$, shown as a representative, are coupled to the input terminal of the main amplifier MA0. The main amplifier MA0 is constructed of an amplifying circuit AMP, a latch circuit FF and an output selecting circuit SLC.

In order to have a large gain, the amplifier AMP is constructed of two-step amplifying circuits 1st and 2nd connected in cascade, although not limited thereto. Thus, the amplifying circuit AMP outputs a signal of a sufficient level even at a timing in which the data signal applied between the common complementary data lines $\overline{CD0}$ and CD0 is not changed to a large level. Accordingly, the memory is enabled to perform high-speed operations.

In order to lessen the sensitivity to noise, each of the 1st and 2nd amplifying circuits is made to have a fully differential amplifier construction, i.e., the construction which is equipped with one pair of complementary output terminals in addition to one pair of complementary input terminals. In order to augment the gain, moreover, each of the circuits 1st and 2nd is constructed of one pair of differential amplifiers having current mirror loads.

In the amplifying circuit, one of its components, i.e., the paired differential amplifiers is composed, of: N-channel differential amplification MOSFETs Q7 and Q8; P-channel load MOSFETs Q5 and Q6 connected between the drains of the former and the supply voltage Vcc; and an N-channel power switch MOSFET Q13 connected between the common sources of the aforementioned differential amplification MOSFETs Q7 and Q8 and the ground potential point of the circuit. The aforementioned load MOSFETs Q5 and Q6 are an active load circuit having the current mirror form. The other of the aforementioned differential amplifiers is composed of N-channel differential amplification MOSFETs Q11 and Q12 and P-channel load MOSFETs Q9 and Q10, which are similar to the aforementioned ones. The aforementioned differential amplification MOSFETs Q11 and Q12 have their common sources shared with the common sources of the aforementioned one-side differential amplification MOSFETs Q7 and Q8 and have their operations controlled by the aforementioned power switch MOSFET Q13. The main amplifier operation timing signal φma is fed to the gate the MOSFET Q13.

Both the gate of the N-channel MOSFET Q7 acting as the inverted input terminal of the aforementioned one differential amplifier and the gate of the N-channel MOSFET Q11 acting as the non-inverted input terminal of the other differential amplifier are coupled to the common complementary data line $\overline{CD0}$. Moreover, the gate of the N-channel MOSFET Q8, acting as the non-inverted input terminal of the aforementioned one differential amplifier, and the gate of the N-channel MOSFET Q12, acting as the inverted input terminal of the other differential amplifier, are coupled to the aforementioned common complementary data line CD0.

One pair of the output signals of the 1st differential amplifier are fed, although not limited thereto, to one pair of the input terminals of the 2nd differential amplifier which is constructed as enclosed by two dotted chain lines. The respective circuit elements of that 2nd differential amplifier are similar to those of the aforementioned 1st differential amplifier, and circuit symbols and their explanations are accordingly omitted.

One pair of the output signals of the aforementioned 2nd differential amplifier are fed to the latch circuit FF. This latch circuit FF is constructed of two NAND gate circuits G5 and G6, although not limited thereto. One of the input and output of the NAND gate circuits G5 and G6 are cross-coupled. The other input of the NAND gate circuits G5 and G6 is fed with the output signal of the aforementioned 2nd differential amplifier. Between the input of the aforementioned NAND gate circuits G5 and G6 and the supply voltage Vcc, there are connected P-channel MOSFETs Q14 and Q15 which receive the operation timing signal $\phi$ma of the aforementioned main amplifier. The latch circuit FF holds the amplified output signal of the 2nd differential amplifier if the amplifying circuit AMP is rendered operative by the high level of the operation timing signal $\phi$ma and if the aforementioned P-channel MOSFETs Q14 and Q15 are turned off. Moreover, the latch circuit FF latches the recieved information if the aforementioned amplifying circuit AMP is rendered inoperative by the low level of the operation timing signal $\phi$ma and if the aforementioned P-channel MOSFETs Q14 and Q15 are turned on, because the other inputs of the NAND gate circuits G5 and G6 are forced to take the high level (or a logic "1") such as the supply voltage Vcc.

The operation timing signal $\phi$ma is output from the timing generating circuit TG shown in FIG. 1. The specific structure of the timing circuit TG will be described hereinafter with reference to FIG. 5.

One pair of the output signals of the aforementioned latch circuit FF are transmitted through the output selecting circuit SLC to the input of a common data output circuit DOB. The output selecting circuit SLC is constructed of two output selecting circuits SLC1 and SLC2. One output selecting circuit SLC1 which receives the output signal of the NAND gate circuit G5 forming part of the aforementioned latch circuit FF is constructed of: a CMOS inverter circuit composed of a P-channel MOSFET Q17 and a N-channel MOSFET Q18; and a P-channel MOSFET Q16 and an N-channel MOSFET Q19 for feeding the CMOS inverter circuit with the supply voltage Vcc and the ground potential of the circuit. The MOSFETs Q16 and Q19 are driven by signals of opposite phases to have an identical switched state. The output selecting circuit SLC1 is rendered operative as its MOSFETs Q16 and Q19 are turned on. If the MOSFETs Q16 and Q19 are turned off, on the contrary, the output selecting circuit SLC1 is rendered inoperative to have its output in a high impedance state. The other output selecting circuit SLC2 which receives the output signal of the NAND gate circuit G6 forming part of the aforementioned latch circuit FF is constructed of: a P-channel MOSFET Q21 and an N-channel MOSFET Q22 composing a similar CMOS inverter circuit to the aforementioned one; and a P-channel MOSFET Q20 and an N-channel MOSFET Q23 for feeding operating voltages to the former MOSFETs Q21 and Q22. The output of the output selecting circuit SLC2 is raised to a high impedance state if the aforementioned MOSFETs Q20 and Q23 are turned off.

The output terminals of the output selecting circuits SLC1 and SLC2 in the main amplifier MA0 are connected commonly, together with the output terminals of the output selecting circuits of the main amplifiers MA1 to MA3 of FIG. 1, with the paired input lines $\overline{CD5}$ and CD5 of the output circuit DOB. These input lines CD5 and $\overline{CD5}$ are the common output lines of the main amplifiers MA0 to MA3.

The main amplifier MA0 having the construction thus far described has its operations controlled by the timing signal $\phi$ma and the output signal of the decoder DEC.

More specifically, the amplifying circuit AMP and the latch circuit FF in the main amplifier MA0 have their respective operations controlled by the operation timing signal $\phi$ma, as has been described hereinbefore.

The output selecting circuit SLC has its operations controlled by the output signal of the decoder DEC. This decoder DEC has unit circuits which correspond one-to-one to the respective main amplifiers. Each of the unit circuits of the decoder DEC is constructed to decode the different combinations of the 2-bit complementary address signals mxn and myn which are fed from the multiplexer MPX.

The unit circuit of the decoder DEC corresponding to the main amplifier MA0 is constructed, as shown in FIG. 3, of NAND gate circuits G2 and G4 which are to be fed with address signals $\overline{mxn}$ and $\overline{myn}$ at false levels. The NAND gate circuit G2 is made to correspond to a later-described input selecting circuit SLC3 whereas the NAND gate circuit G4 is made to correspond to the output selecting circuit SLC. The unit circuit of the decoder DEC, corresponding to the main amplifier MA0, is constructed of the NAND gate circuits G2 and G4 and NOR gate circuits G1 and G7. In this case, a NAND gate circuit G12 is deemed to the common circuit of the decoder DEC. In other words, the output $\overline{DS}$ of the NAND gate circuit G12 is fed to the NOR gate circuits G7 corresponding to the main amplifiers MA1 to MA3, respectively.

The output of the NAND gate circuit G4 is set at a low level if both the address signals $\overline{mxn}$ and $\overline{myn}$ take high levels. The resultant output signal is fed to one input of the NOR gate circuit G7 for generating the operation timing signal of the output selecting circuit SLC. The other input of the NOR gate circuit G7 is fed with the output $\overline{DS}$ of the NAND gate circuit G12 which is receptive of both an internal control signal C1 generated in synchronism with the column address strobe signal $\overline{CAS}$ and a row timing signal RG2 generated on the basis of the operation timing signal $\phi$pa. The output of that NOR gate circuit G7 is, on one hand, inverted by a CMOS inverter circuit IV3 and then fed to the gates of the P-channel MOSFETs Q16 and Q20 of the output selecting circuit SLC. On the other hand, the output of the NOR gate circuit G7 is fed directly to the gates of the N-channel MOSFETs Q19 and Q23 of the output selecting circuit SLC. The output $\overline{DS}$ of the aforementioned NAND gate circuit G12 is inverted by an inverter not illustrated and then is fed to the gates of P-channel MOSFETs Q24 and Q25 which are disposed in the input lines $\overline{CD5}$ and CD5 of the data output circuit DOB.

The levels of the input lines $\overline{CD5}$ and CD5 are set in the following manner. Specifically, the output $\overline{DC}$ of the NAND gate circuit G12, i.e., the common circuit of the decoder DEC, is raised to the high level in response to the low level of at least one of the timing signals RG2 and C1 before the start of the memory access and immediately after the start of the memory access by the row address strobe signal $\overline{RAS}$. The respective output selecting circuits of the main amplifiers MA0 to MA3 are brought a high output impedance state in response to the high level of the signal $\overline{DS}$ irrespective of the complementary address signals $\overline{mxn}$ and $\overline{myn}$. The MOSFETs Q24 and Q25 are turned on by a signal DS having a level inverted from that of the signal $\overline{DS}$. As a result, both the lines $\overline{CD5}$ and CD5 are at the high level or the so-called "reset level".

The output signal $\overline{DS}$ of the NAND gate circuit G12 is dropped to the low level at the time determined by the timing signals RG2 and C1, i.e., at a suitable timing after the sense amplifiers SA1 and SA2 and the column switch circuits C-SW1 and C-SW2 of FIG. 1 have been operated. The MOSFETs Q24 and Q25 are turned off in response to the low level of the signal $\overline{DS}$. When this signal $\overline{DS}$ is dropped to the low level, the one of the plural output selecting circuits coupled to the lines $\overline{CD5}$ and CD5 which corresponds to the complementary address signals mxn and myn is rendered operative. As a result, the levels of the lines of the lines and $\overline{CD5}$ and CD5 are determined by the output selecting circuit being rendered operative.

A specific example of the data output circuit DOB in the input/output circuit I/O of FIG. 1 is shown in FIG. 3.

The data output circuit DOB is constructed of a tri-state circuit, although not limited thereto.

Specifically, the data output circuit DOB is equipped with a first-step circuit which is constructed of a latch circuit composed of NAND gate circuits G8 and G9 similar to the latch circuit FF forming part of the aforementioned main amplifier MA0. The latch circuit receives the data signals which are fed from the main amplifiers MA0 to MA3 to the input lines $\overline{CD5}$ and CD5. The latch circuit also latches the previous data signals, if the input lines $\overline{CD5}$ and CD5 are at the reset levels.

The output signals of the latch circuit are transmitted to the gates of a N-channel output MOSFET Q26 and Q27 of push-pull form, respectively, via a NAND gate circuit G10, a CMOS inverter circuit IV5, a NAND gate circuit G11 and a CMOS inverted circuit IV6. An operation timing signal DOE is fed to the other inputs of the aforementioned NAND gate circuits G10 and G11.

The operation timing signal DOE responds to the row address strobe signal $\overline{RAS}$, the column address strobe signal $\overline{CAS}$ and the write enable signal $\overline{WE}$ and is raised to the high level at such an output timing as will be described hereinafter.

Now, if the timing signal DOE is at the high level (i.e., the logic "1"), the NAND gate circuits G10 and G11 output a lower level (i.e. the logic "0"). In response to this, the signal being outputted from the first-step circuit is sent to the external terminal $D_{out}$ via those gate circuits G10 and G11, the CMOS inverter circuits IV5 and IV6 and the output MOSFETs Q26 and Q27. If the aforementioned timing signal DOE is at the low level, such as the ground potential of the circuit, both the outputs of the NOR gate circuits G10 and G11 take the high level. In response to this, both the inverter circuits IV5 and IV6 are caused to take the low level, and the output MOSFETs Q26 and Q27 are both turned off. As a result, the output is brought into the high impedance state.

According to the present embodiment, the aforementioned external output terminal $D_{out}$ is made independent of the external input terminal $D_{in}$, to which the input terminal of a later-described data input circuit DIB is to be coupled, but may be integrated, if necessary, with the external input terminal $D_{in}$ into one common external terminal.

In response to the write data signal fed to the external input terminal $D_{in}$, the data input circuit DIB of the input/output circuit I/O of FIG. 1 together with the data output circuit DOB outputs both the write signals in phase and opposite-phase (or a complementary signal) with the write data signal to common write lines $\overline{CD6}$ and CD6. These common write lines $\overline{CD6}$ and CD6 are coupled to not only the main amplifier MA0 shown in FIG. 3 but also the main amplifiers MA1 to MA3 shown in FIG. 1.

The main amplifier MA0 is equipped, as shown in FIG. 3, with data writing N-channel transmission gate MOSFETs Q1 and Q2 which are connected, respectively, between the common write line $\overline{CD6}$ and the common data line $\overline{CD0}$ and between the common write line CD6 and the common data line CD0. The main amplifier MA0 is further equipped, although not limited thereto, with N-channel load MOSFETs Q3 and Q4 which are connected between the common data lines $\overline{CD0}$, CD0 and the supply terminal Vcc. Those load MOSFETs Q3 and Q4 are made to have relatively small conductances.

To the gates of the transmission gate MOSFETs Q1 and Q2 for transmitting the output signal of the aforementioned data input circuit DIB, is fed the output selecting signal of the decoder DEC which is constructed of the following NOR gate circuit G1 and NAND gate circuit G2. To the input of this NAND gate circuit G2 are fed the address signals $\overline{mxn}$ and $\overline{myn}$ similar to the aforementioned ones and a write control signal WYP. The output of the NAND gate circuit G2 is fed to one input of the NOR gate circuit G1. The other input of this NOR gate circuit G1 is fed with an inverted internal column address strobe signal $\overline{C1}$. Although not limitative, the write control signal WYP to be outputted from the timing generating circuit TG has its phase opposed to that of the write enable signal $\overline{WE}$ fed from the outside. If both the address signals $\overline{mxn}$ and $\overline{myn}$ are caused to take the high level, the output of the NAND gate circuit G2 is accordingly caused to take the low level. The output of the NOR gate circuit G1 is caused to take the high level as the internal column timing signal $\overline{C1}$ changing in same phase with the column address strobe signal $\overline{CAS}$ is caused to take the low level, and the transmission gate MOSFETs Q1 and Q2 are turned on in accordance with the high-level output of the NOR gate circuit G1. As a result, the write signal fed from the external input terminal $D_{in}$ is transmitted to the common complementary data lines CD0 and $\overline{CD0}$ corresponding to the signals $\overline{mxn}$ and $\overline{myn}$. Since during the reading operation, the control signal WYP is made to take the low level, the output of the NAND gate circuit G2 takes the high level irrespective of the states of the address signals $\overline{mxn}$ and $\overline{myn}$. Thus, the output of the NOR gate circuit G1 takes the low level so that the aforementioned transmission gate MOSFETs Q1 and Q2 are turned off.

The output of the aforementioned NOR gate circuit G1 is inverted by a CMOS inverter circuit IV1 and then is transmitted to the N-channel MOSFETs Q3 and Q4. As a result, when during operations, other than the aforementioned writing operation, the MOSFETs Q3 and Q4 are turned on to apply a substantially constant bias level to the common complementary data lines CD0 and $\overline{CD0}$. Since the signal amplitudes of the common complementary data lines CD0 and $\overline{CD0}$ are limited during the reading operation by the ON states of MOSFETs Q3 and Q4, the signals read out from the memory cells can be at a high speed.

Figure 4:
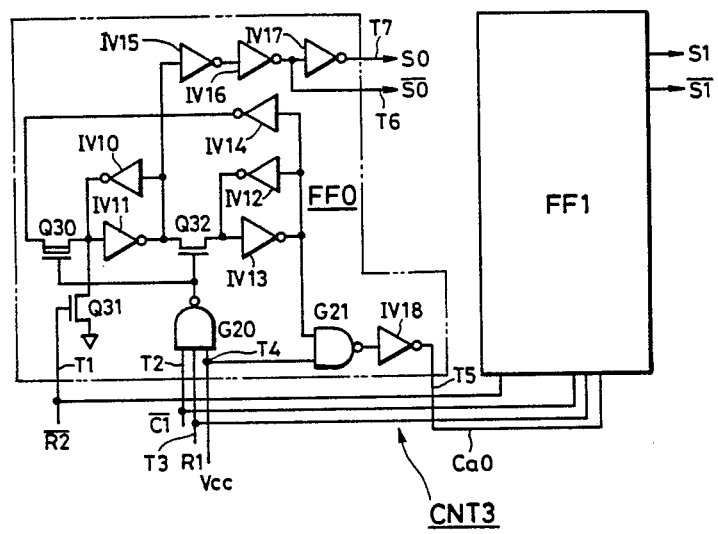
FIG. 4 is a circuit diagram showing a counter.

FIG. 4 is a circuit diagram showing one embodiment of the 2-bit binary counter CNT3 contained in the timing generating circuit TG. Although not especially limitative, the aforementioned address counter COUNT can be constructed of a circuit similar to the circuit of the counter 3.

A first-step circuit FF0 of the 2-bit binary counter CNT3 is constructed of the following individual circuits enclosed by two dotted chane lines in the same Figure and is equipped with a reset input terminal T1, a step-by-step pulse input terminal T2, a counting operation control terminal T3, a carry input terminal T4, a carry output terminal T5, and counted value output terminals T6 and T7. A CMOS inverter circuit IV11 has its output signal fed back to the input thereof via a feedback CMOS inverter circuit IV10. Thus, the CMOS inverter circuits IV11 and IV10 construct together a master flip-flop. In order to prevent the level of a signal fed via a MOSFET Q30 to the input of the inverter circuit IV11 from being controlled, the inverter circuit IV1 is composed of P-channel and N-channel MOSFETs having relatively small mutual conductances, although not limited thereto. CMOS inverter circuits IV13 and IV12 similar to the aforementioned ones construct a slave flip-flop. The output signal of the CMOS inverter circuit IV11 or the output of the aforementioned master flip-flop is transmitted via an N-channel transmission gate MOSFET Q32 to the input of the CMOS inverter circuit IV13 or the input of the slave flip-flop. The CMOS signal of the CMOS inverter circuit IV13 or the output of that slave flip-flop is fed back via the CMOS inverter circuit IV14 and the P-channel transmission gate MOSFET Q30 to the input of the CMOS inverter circuit IV11 or the input of the master flip-flop. A resetting N-channel MOSFET Q31 is connected between the input of the CMOS inverter circuit IV11 or the input of the aforementioned master flip-flop and the ground potential point of the circuit.

In the case when the counter FF0 is used as the aforementioned address counter COUNT, the input address signal is fed via the MOSFET Q31 acting as the transmission gate.

The aforementioned transmission gate MOSFETs Q30 and Q32 have their gates fed with the output signal of an NAND gate circuit G20. This NAND gate circuit G20 has its one input, i.e., the step-by-step pulse or clock input terminal T2 fed with the aforementioned column timing signal $\overline{C1}$ and its another input terminal, i.e., the operation control terminal fed with a row timing signal R1. Since the remaining one input terminal of the NAND gate circuit G20, i.e., the carry input terminal T4 is maintained at a high level equal to the supply voltage Vcc because the circuit FF0 constitutes the first-step circuit of the counter CNT3. The high-level signal of that carry terminal T4 and the output signal of the slave flip-flop are fed to a NAND data circuit G21. The output of this NAND gate circuit G21 is inverted by a CMOS inverter circuit IV18 and is then sent out as a carry signal ca0 to the carry input terminal of a succeeding-step circuit FF1. The output of the aforementioned master flip-flop in the circuit FF0 is sent out as the counted output via CMOS inverter circuits IV15 to IV17 having a series form, although not especially limited thereto. In other words, an inverted counted output $\overline{s0}$ is generated from the output of the CMOS inverter circuit IV16 whereas a non-inverted counted output is generated from the output of the CMOS inverter circuit IV17.

The succeeding-step circuit FF1 is constructed of the same circuit as that of the aforementioned first-step circuit FF0. Here, the circuit FF1 has its carry input terminal fed with the carry signal ca0 which is generated by the aforementioned first-step circuit FF0.

By combining the counted outputs s0 and $\overline{s0}$, and s1 and $\overline{s1}$ of the 2-bit binary counter circuit CNT3, the timing generating circuit TG generates the timing signal $\phi$ma of the main amplifier, the data line selecting timing signal $\phi$y and the step-by-step pulses of the counter circuit CNT2 in the aforementioned extended nibble mode which will also be hereinafter.

Figure 5:
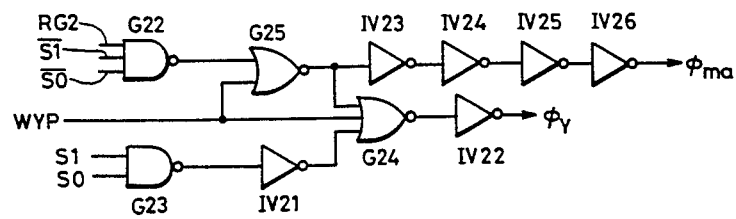
FIG. 5 is a circuit diagram showing a portion of a timing generator.

FIG. 5 is a circuit diagram of a timing generating circuit of the aforementioned timing generating circuit TG for generating the main amplifier operation timing signal $\phi$ma and the data selecting timing signal $\phi$y.

The aforementioned row timing signal RG2 and the counted output signals $\overline{s0}$ and $\overline{s1}$ generated by the binary counter CNT3 of FIG. 4 are fed to the input of a NAND gate circuit G22. The output of this NAND gate circuit G22 is inputted together with the aforementioned write signal WYP to a NOR gate circuit G25. The output of this NOR gate circuit G25 is fed to a plurality of steps of CMOS inverter circuits IV23 to IV26 connected in cascade for acting as delay circuits. In response to this, the main amplifier operation timing signal $\phi$ma, which has its timing adjusted suitably (or delayed) with respect to the column selecting timing signal $\phi$y, is output from the CMOS inverter circuit IV26.

The counted output signals s0 and s1 of the aforementioned binary counter are fed to the input of a NAND gate circuit G23. The output of this NAND gate circuit G23 is inverted by a CMOS inverter circuit IV21 and is fed together with the output of the aforementioned NOR gate circuit G25 and the write control signal WYP to the input of a NOR gate circuit G24. The output of this NOR gate circuit G24 is inverted through a CMOS inverter circuit IV22 and is sent out as the data line selecting timing signal $\phi$y.

The step-by-step pulses of the counter circuit CNT2 are generated when both the counted outputs s0 and s1 take the high (or $\overline{s0}$ and $\overline{s1}$, low) level. The aforementioned step-by-step pulses can be generated, for example, by such an AND gate circuit in the timing generating circuit TG receptive to the counted outputs s0 and s1. More specifically, each of the aforementioned step-by-step pulses is generated at every four counts of the counter CNT3.

Next, one example of the reading operations will be described with reference to the timing chart shown in FIG. 6.

When the row address strobe signal $\overline{RAS}$ is dropped to the low level, as indicated by A in FIG. 6, the timing signal $\phi$cr (although not shown in the drawing) is accordingly raised to the high level. When the timing signal $\phi$cr is raised to the high level, the row address buffer R-ADB receives the row address signal being fed from the external terminal. Of the aforementioned address signals, the highest-bit address signal axn is received as an initial value into the 2-bit binary address counter CNT1 contained in the address counter COUNT, as has been described hereinbefore. In response to both the remaining address signals ax0 to axn-1 of the address signals having been received in the aforementioned row address buffer R-ADB and the word line selecting timing signal $\phi x$, the row address decoders R-DCR1 and R-DCR2 perform the operations of selecting the word lines and dummy word lines in the memory arrays M-ARY1 and M-ARY2. Next, the timing signals $\phi pa$ and $\overline{\phi}pa$ are generated so that the sense amplifier SA is rendered operative to amplify the data signals read out from the memory cells (although not shown in the drawing). In synchronism with the operation timing of the sense amplifier, the row timing signal RG2 rises to the high level.

The signal $\overline{R2}$, fed to the aforementioned 2-bit binary counter CNT3 shown in FIG. 4 rises to the high level in response to the high level of the row address signal $\overline{RAS}$ for a predetermined chip non-selecting period. As a result, the counter CNT3 is brought in advance into its reset state for the chip non-selecting state so that its counted outputs s0 and s1 are dropped together to the low level (or its other counted outputs $\overline{s0}$ and $\overline{s1}$ are raised to the high level).

Next, when the column address strobe signal $\overline{CAS}$ is dropped to the low level, the timing signal $\phi cc$ (although not shown in the drawing) is responsively raised to the high level so that the column address signal fed from the aforementioned external terminal is received into the column address buffer C-ADB. As has been described hereinbefore, the timing signal $\phi cc$ is used as the control signal for setting the initial value of the address counter COUNT. As a result, when the timing signal $\phi cc$ is generated, both the address signal axn generated in advance by the row address buffer R-ADB and the address signals ay0 to ayn output from the column address buffer C-ADB are held as initial values in the address counter COUNT.

The timing signal $\phi mpx$ (although not shown in the drawing) for controlling the operations of the multiplexer MPX is held at the low level without response to the first change of the column address strobe signal $\overline{CAS}$ to the low level, as has been described hereinbefore. As a result of the timing signal $\phi mpx$ being dropped to the low level, both the address signals ay0 to ayn, having been received into the column address buffer C-ADB and the address signal axn having been received into the row address buffer R-ADB, are fed as the signals my0 to myn-1 through the multiplexer MPX to the column address decoder C-DCR and as the signals myn and mxn to the decoder DEC of the main amplifier.

The data line selecting timing signal $\phi y$ and the main amplifier operation timing signal $\phi ma$ are synchronously raised to the high level by the aforementioned circuit (which is shown in FIG. 5).

More specifically, the timing signal $\phi ma$ generated just after the column address strobe signal $\overline{CAS}$ has been dropped to the low level rises to the high level in synchronism with the high level of the aforementioned row timing signal RG2 because the aforementioned binary counter CNT3 is reset, as has been described hereinbefore. Since both the counted outputs s0 and s1 of the aforementioned binary counter are at the low level, the data line selecting timing signal $\phi y$ is generated in synchronism with the aforementioned first timing signal $\phi ma$ by the aforementioned circuit shown in FIG. 5. In response to the aforementioned timing signal $\phi y$, the column switch circuits C-SW1 and C-SW2 are operated so that the data signals read out from the memory cells are fed to the common complementary data lines $\overline{CD0}$ to CD3. In response to the timing signal $\phi ma$, the four main amplifiers MA3 are brought concurrently their operative states. In other words, the data signals read out from the memory cells and appearing on the common complementary data lines CD0 and $\overline{CD0}$ to CD3 and $\overline{CD3}$ are amplified.

The data signals amplified by the main amplifiers MA0 to MA3 are transferred in the following manner to the external terminal $D_{out}$.

If the address signals axn and ayn recieved in advance in the address buffers R-ADB and C-ADB are at the high level, the output of the main amplifier MA0 is selected for the first time in the following manner. More specifically, the timing signal $\overline{DS}$ (although not shown in the drawing) is drops to the low level in the first high-level period of the row timing signal C1 (i.e., the period 0 for which the row address strobe signal $\overline{CAS}$ is dropped for the first time to the low level) after the aforementioned row timing signal RG2 has been generated. As a result the timing signal $\overline{DS}$ is dropped to the low level and the signals axn and ayn are at the high level, the output of the NOR gate circuit G7 of FIG. 3 is rises to the high level. In response to this high level, the N-channel MOSFETs Q19 and Q23 are turned on together with the P-channel MOSFETs Q16 and Q20 by the low level which is inverted by the CMOS inverter circuit IV3. In response to this, the output of the latch circuit FF is fed to the data output circuit DOB through the input lines $\overline{CD5}$ and CD5 so that the first data signal D0 is sent out to the external terminal $D_{out}$ in accordance with the timing signal DOE.

Next, when the column address strobe signal $\overline{CAS}$ is rises to the high level, the internal signal C1 is responsively changed to the low level, as indicated at D in FIG. 6. As a result, the inverted internal signal $\overline{C1}$ fed to the binary counter CNT3 shown in FIG. 3 takes the high level so that the N-channel MOSFET Q32 is turned off whereas the N-channel MOSFET Q30 is turned on. Thus, the slave-side output signal is inverted by the CMOS inverter circuit IV14 and is fed back to the master side. As a result, the counted output s0 is changed to the high level. By this change in the output s0 by the counting operation, the aforementioned main amplifier operation timing signal $\phi ma$ and the data line selecting timing signal $\phi y$ are dropped to the low level. Thus, the main amplifiers MA0 to MA3 are rendered inoperative whereas the column switch circuits C-SW1 and C-SW2 are turned off. Despite of this fact, however, the latch circuits FF contained in the main amplifiers MA0 to MA3 still hold the aforementioned received storage information because their respective P-channel MOSFETs Q14, Q15 are turned on by the low level of the aforementioned timing signal $\phi ma$.

In accordance with the present embodiment, as has been described hereinbefore, when the row address strobe signal $\overline{RAS}$ is left in the state of the low level whereas the column address strobe signal $\overline{CAS}$ is raised to the high level, this mode is deemed as the nibble one, and the multiplexer MPX has its output switched automatically to the side of the address counter COUNT. The timing signal $\phi mpx$ for controlling the operations of the multiplexer MPX is reset by the high level of the row address strobe signal $\overline{RAS}$ and can be generated by the latch circuit which is set under the aforementioned conditions. In place of this internal logic circuit, the switching control of the aforementioned multiplexer may be performed by a predetermined control signal fed from the outside.

The address counter CNT1 has its content subjected to the step-by-step operation in response to the low level of the internal signal C1. In other words, the address signal cyn and cxn are advanced stepwise from the initial values which have been set by the signals axn and ayn.

The address signals cyn and cxn thus advanced are fed through the multiplexer MPX to the decoder DEC because the timing signal φmpx is caused to take the high level, as has been described hereinbefore. In other words, the main amplifier MA1 next to the main amplifier MA0 selected for the first time is selected.

When the column address strobe signal $\overline{CAS}$ is caused again to take the low level (for a period 1), as indicated at C in FIG. 6, the timing signal C1 rises again to the high level, as indicated at D in FIG. 6. In response to the high level of the timing signal C1, the output selecting circuit of the main amplifier MA1 is rendered operative. As a result, the subsequent data D1 held in the aforementioned latch circuit FF of the main amplifier MA1 is outputted.

Then, the step-by-step operations of the address counter CNT1 are executed likewise by the column address strobe signal $\overline{CAS}$ so that the output selecting circuit is controlled in accordance with the 2-bit address signals cyn and cxn generated by the step-by-step operations, and the 4-bit data signals D0 to D3 latched in the aforementioned latch circuit FF are read out continuously. These operations are substantially similar to those of the nibble mode of the prior art.

When the 4th-bit data signal D3 is to be output, both the counted outputs s0 and s1 of the binary counter CNT3 are raised to the high level. The address counter CNT2 for generating the address signals cy0 to cyn-1 is incremented by 1 in response to the simultaneous high level of the outputs s0 and s1 of the counter CNT3, as has been described hereinbefore. At the same time, the data line selecting timing signal φy is raised again to the high level, as indicated by H in FIG. 6, by the high level of the outputs s0 and s1. In response to this, the column address decoder C-DCR generates a selecting signal for selecting a subsequent column address yi+1 in synchronism with the timing singal φy so that the column switch is switched.

Next, the column address strobe signal $\overline{CAS}$ is changed again to the high level after a period 3 indicated at C in FIG. 6, and the counted output of the binary counter CNT3 is caused to restore its initial value. In response to this, the main amplifier operation timing signal φma is generated again to effect the amplifying operations of the data signals read out from the aforementioned data lines having already been switched, the receiving of the latch circuits FF and the switching operation of the output selecting circuits. When the column address strobe signal $\overline{CAS}$ drops again to the low level (for a period 4), one of the plural output selecting circuits is rendered operative so that a 5th-bit data signal D4 is output to the external terminal $D_{out}$. Likewise, the 6th- to 8th-bit data signals D5 to D7 can be generated. In this case, the aforementioned 5th-bit read data signal D4 can be outputted at a remarkably high speed with a delay being required merely for the amplification of the main amplifier because the column selecting operations have already been performed.

Likewise, the high-speed data reading operations can be performed continuously in synchronism with the column address strobe signal $\overline{CAS}$.

All the circuits are reset by raising the row address strobe signal $\overline{RAS}$ to the high level. In the case when the data is to be read out in single bits therefore, it is sufficient to raise the row address strobe signal $\overline{RAS}$ and the column address strobe signal $\overline{CAS}$ to the high level after the 1-bit data signal has been read out.

Figure 7:
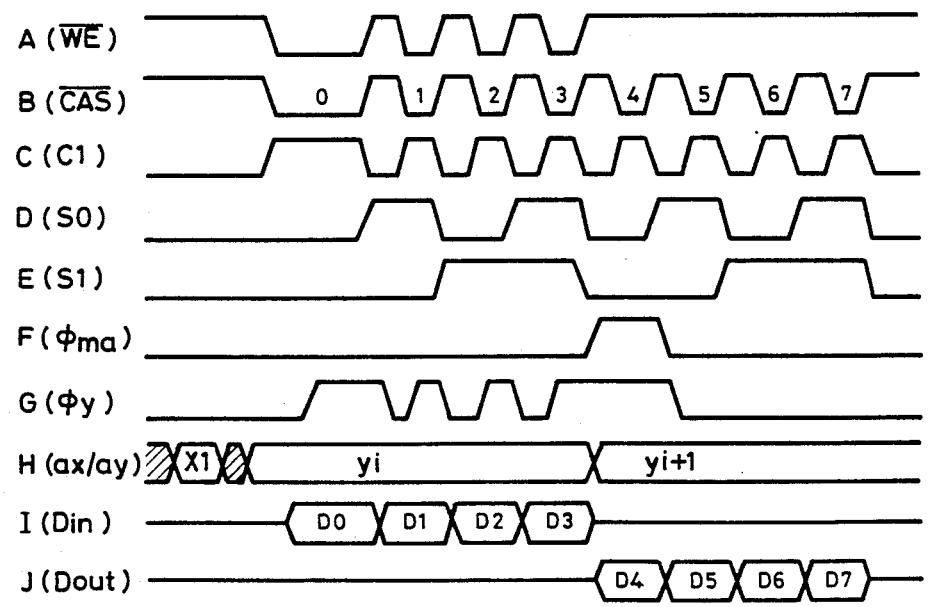

FIG. 7 is a timing chart showing one example of the writing operations.

In these writing operations, the internal control signal WYP is raised to the high level in response to the low level of the write enable signal $\overline{WE}$. As a result, in the writing operations, the data line selecting timing signal φy is generated (or raised to the high level), but the main amplifier operation timing signal φma is not generated (but is dropped to the low level). Thus, the write data fed sequentially to the input of the data input circuit DIB shown in FIG. 3 in synchronism with the column address strobe signal $\overline{CAS}$ is transmitted to common complementary data lines, respectively, through transmission gate MOSFETs Q1 and Q2, which are switched by the output of the address counter generated as in the case of the aforementioned reading operation, so that the writing operations can be performed continuously. In this case, the column addresses are switched for every four bits, and the writing operations can be performed at the remarkably high speed because the write signals of full swing (e.g., at 5 V and 0 V) are transmitted to the memory cells via the common complementary data lines, the column switch MOSFETs and the data lines. Thus, the continuous writing operations described above can be performed in the same operation cycle as that of the reading operations without any previous column switching operation.

The row timing signal RAS are omitted from the timing chart shown in FIG. 7 because they are similar to those of FIG. 6.

The following effects can be attained according to the present invention:

(1) One effect is that the nibble reading operations can be realized continuously at a high speed, when the signals read out in parallel are latched in the latch circuits and are sent out serially in synchronism with the address strobe signal, by switching the step-by-step operations of the column address signal and the data line selecting operations in response to the timing signal which is generated by the built-in counter circuit before all the bits of the latched information are output serially.

(2) Another effect is that the aforementioned high-speed continuous reading operations can be performed remarkably conveniently because they generate the timing signals and the address signals with the built-in counter to make it sufficient to feed the initial address signal and the column address strobe signal as a clock from the outside.

(3) Still another effect is that, according to the aforementioned items (1) and (2), a dynamic RAM suitable for the memory for storing image processing picture element data can be provided because all the reading operations of the memory cells disposed on one word line can be performed simply and promptly.

Although the invention been described specifically in connection with the embodiment thereof, it should not be limited to the aforementioned embodiment but can naturally be modified in various ways without departing from the gist thereof.

The circuits (i.e., the latch circuits FF) for latching the plural signals, which are read out in accordance with the internal address signal synchronized with the column address strobe signal, may be provided in positions other than the main amplifiers. For example, the complementary outputs of the main amplifiers may be fed directly to the latch circuit which is constructed of the gate circuits G8 and G9 in the data output circuit DOB. In other words, the latch circuits (G8 and G9) acting as the first-step circuit of the data output circuit DOB are provided in a manner to correspond to and in the same number (e.g., four) as that of the main amplifiers to be selected by one internal address signal. Like the aforementioned embodiment, the input terminal of one of the gate circuits G8 and G9 from the main amplifier MA is equipped with the load MOSFETs Q14 and Q15 which are to be controlled by the signal φma. The outputs of the first-step circuits G8 and G9 are fed to the output selecting circuits SLC which are provided to correspond to the former and to be controlled by the decoder DEC. In the data output circuit DOB, more specifically, the output selecting circuit SLC is provided in the same number (e.g., our) as that of the latch circuits constructed of the gate circuits G8 and G9. The outputs of the plural output selecting circuits SLC are fed to the input terminal of one of the gate circuits G10 and G11 via one pair of their common lines (which correspond to the lines CD5 and $\overline{CD5}$). In other words, each of the gate circuits G10 and G11 is provided one in number. According to this modified example, the plural signals read out in accordance with the internal address signal are amplified by the main amplifier MA and are then latched by the output circuit DOB (or by its latch circuits). And, the output selecting circuit SLC in the circuit DOB is selected sequentially by the decoder DEC. In response to this, the signals latched in the latch circuits are sent out sequentially to the output terminal $D_{out}$. In this example, the plural signals read out in accordance with the internal address signal are wholly sent out to and latched by the data output circuit DOB.

On the other hand, the latch circuit FF and the output selecting circuits SLC shown in FIG. 3 can be laid out in places other than the vicinity of the main amplifier MA. Specifically, the plural circuits FF and SLC may be arranged together in close vicinity to the output circuit DOB In other words, the circuits FF and SLC form part of the output circuit DOB.

The memory array may be divided not only into two mats but also four mats, each of which is equipped with an input/output circuit for realizing the aforementioned write/read operations Moreover, the aforementioned plural bits should not be only four but may be modified such that eight pairs of input/output circuits are provided for eight pairs of common complementary data lines so that data of 8 bits may be written in or read out continuously.

Still moreover, all the address signals to be fed to the column decoder may be fed from the external terminal. In the timing chart shown in FIG. 5, for example, the address signal for instructing the data line to be selected subsequently may be fed from the outside in synchronism with the column address strobe signal $\overline{CAS}$ (3) for reading out the 4th-bit data. In this case, the continuous nibble mode can be executed by designating an arbitrary address.

On the other hand, the specific constructions of the individual circuits can take a variety of forms.

The present invention can be applied widely to the dynamic RAM.

What is claimed is:

1. A semiconductor memory comprising:
   a plurality of memory cells; selecting means for selecting a plurality of memory cells in said plurality of memory cells in accordance with first internal address signals; an input means for inputting data to the selected memory cells; storing means for storing a plurality of data read out of the selected memory cells; an output means for outputting said stored data in said storing means sequentially in response to change in a second internal address signal; signal generating means for generating said first internal address signals which indicate a plurality of memory cells to next be selected during the time that said storing means stores the data read out of the selected memory; and during the time that said storing means store data read out of the selected memory cells, said selecting means select a next plurality of memory cells.

2. A semiconductor memory according to claim 1 wherein:
   said storing means are main amplifiers having outputs on which are output sequentially through said output means.

3. A semiconductor memory according to claim 1 wherein:
   said signal generating means is an address counter which generates said first internal address signals by performing a counting operation.

4. A semiconductor memory according to claim 1 wherein:
   each of said memory cells includes a capacitor for storing a data signal and a MOSFET coupled to the capacitor which functions as a dynamic RAM, and wherein a change in said second internal address signal occurs in synchronism with a change in a column address strobe signal.

5. A semiconductor memory according to claim 4 wherein:
   the counting operation of an address counter is performed in response to a predetermined change in the column address strobe signal during a time that storing means stores the data read out of the selected memory cells.

6. A semiconductor memory according to claim 1 wherein:
   an initial value of an address counter is set by an address signal received from an external terminal.

7. A semiconductor memory comprising:
   a plurality of first data lines, each data line being coupled to a first memory cell;
   a plurality of second data lines, each of the second data lines being coupled to a second memory cell;
   first and second common data lines;
   selecting means for selecting one of said first data lines and one of said second data lines in accordance with internal column address signals;
   first switching means coupled between said first data lines and said first common data line, and to said selecting means for coupling a selected first data line to said first common data line;
   second switching means coupled between said second data lines and said second common data line and to said selecting means for coupling a selected second data line to said second common data line;

input means for inputting signals to the first and second memory cells coupled to the selected first and second data line, respectively;

means, including first store means, for storing a signal read out from the first memory cell coupled to the selected first data line, and second store means for storing a signal read out from the second memory cell coupled to the selected second data line;

control means for controlling said first and second store means so that the signals stored in said first and second store means are sequentially outputted in response to a change in an internal address signal;

internal address signal generating means for generating internal column address signals which indicate first and second data lines to next be selected during a time that said first store means stores the signal read out from the first memory cell coupled to the selected first data line and said second store means stores the signal read out from the second memory cell coupled to the selected second data line in a reading state of said semiconductor memory; and wherein during a time that said first store means stores the signal read out from the memory cell coupled to the selected first data line and said second store means stores the signal read out from the memory cell coupled to the selected second data line, said first switching means and said second switching means couple a next first data line and a next second data line to said first common data line and to said second common data line, respectively, in a reading state.

8. A semiconductor memory according to claim 7 wherein:

each of said first and second memory cells includes a capacitor for storing a data signal and a MOSFET coupled between said capacitor and one of the data lines.

9. A semiconductor memory according to claim 8 wherein:

said internal address signal generating means includes an address counter; and wherein the value of said address counter is set in accordance with the value of external address signals.

10. A semiconductor memory according to claim 9 wherein said selecting means includes:

a column address decoder circuit which receives said internal column address signals.

11. A semiconductor memory according to claim 8 further comprising:

output means, coupled to said means including first store means, second store means and control means, having a first amplifier circuit coupled between said first common data line and said first store means and a second amplifier circuit coupled between said second common data line and said second store means, and wherein said control means includes first output selecting means coupled between said first store means and said output means, second output selecting means coupled between said second store means and said output means and means for controlling operation of said first and second output selecting means in response to a change of said internal address signal so that said first and second output selecting means are selectively operated.

12. A semiconductor memory according to claim 11 wherein said selecting means includes:

a column address decoder circuit which receives said internal column address signal.

13. A semiconductor memory comprising:

a plurality of first data line being lines, each first data coupled to a first memory cell;

a plurality of second data lines, each second data line being coupled to a second memory cell;

first and second common data lines;

selecting means for selecting one of said first data lines and one of said second data lines in accordance with internal column address signals;

first switching means, coupled between said first data lines and said first common data line, and to said selecting means for coupling a selected first data line to first common data line;

second switching means, coupled between said second data lines and said second common data line, and to said selecting means for coupling a selected data line to said second common data line;

input means for inputting signals received on an input terminal to the first and second memory cells coupled to a selected first and a second data line, respectively, sequentially in response to a change in an internal address signals;

means, including first store means, for storing a signal read out from the first memory cell coupled to the selected first data line, second store means for storing a signal read out from the second memory cell coupled to the selected second data line, and control means for controlling said first and second store means so that the signals stored in said first and second store means are sequentially output to an output terminal, in response to the change in an internal address signal;

internal address signal generating means for generating internal column address signals which indicate first and second data lines to next be selected during the time that the signals stored in said first and second store means are sequentially outputted to said output terminal in a reading state of said semiconductor memory; and wherein during the time that signals stored in said first and second store means are sequentially outputted to said output terminal, said first and second switching means couple a next first data line and a next second data line to said first common data line and to said second common data line, respectively during a reading state.

14. A semiconductor memory according to claim 13 wherein:

each of said first and second memory cells includes a capacitor for storing a data signal and a MOSFET coupled between said capacitor and the data line.

15. A semiconductor memory according to claim 14 wherein:

said means including first store means, second store means and control means further includes inhibiting means for inhibiting the stored signals in said first and second store means from being changed by coupling a next first and second data line to said first and second common data lines.

16. A semiconductor memory according to claim 15, wherein:

said internal address signal generating means includes an address counter; and wherein the value of said address counter is set in accordance with a value of external address signals.

17. A semiconductor memory comprising:

a plurality of memory arrays each including a plurality of data lines with each data line being coupled to a plurality of memory cells, and a plurality of word lines with each word line coupled to the memory cells;

word line selecting means, coupled to said memory arrays, for selecting one of word lines in each memory array;

data line selecting means for selecting a plurality of data lines in said memory arrays in accordance with column address signals;

a plurality of common data lines;

switching means, which is coupled between the data lines in one of the memory arrays and the said common data lines and is coupled to said data line selecting means, and which couples selected data lines to said common data lines;

store means, which is coupled to the common data lines, and which stores a signal read out from the memory cells which is coupled to selected data lines and to a selected word line;

control means, coupled to said store means, and for controlling said store means so that the stored signals in said store means are sequentially outputted to an output terminal;

internal column address signal generating means, coupled to said data line selecting means, for generating internal column address signals which indicate a data line to next be selected during a time that the stored signals in said store means are sequentially outputted to said output terminal;

during a time that the signals in said store means are sequentially outputted to said output terminal, said switching means couples the next data lines in one of the memory arrays to said common data lines; and writing means coupled to said common data lines for providing data signals to be written into the memory cells which are coupled to selected word line and to selected data lines.

18. A semiconductor memory according to claim 17, wherein:

said store means further includes inhibiting means for inhibiting the stored signals in said store means from being changed by coupling next data lines to said common data lines.

19. A semiconductor memory according to claim 18 wherein:

said internal address signal generating means includes an address counter; and wherein a value of said address counter is set in accordance with a value of external address signals.

20. A semiconductor memory according to claim 19 wherein:

said internal column address signal generating means includes means for generating internal column address signals which indicate a data line to be next selected in each memory portion after data signals provided by said writing means are written into the selected memory cells.

* * * * *